(12) United States Patent
Yu et al.

(10) Patent No.: US 10,304,971 B2
(45) Date of Patent: May 28, 2019

(54) HIGH SPEED SCHOTTKY RECTIFIER

(71) Applicants: Yutechnix, Inc., Saratoga, CA (US);
Champion Microelectronic Corp.,
Hsinchu (TW)

(72) Inventors: Ho-Yuan Yu, Saratoga, CA (US);
Haiping Dun, Fremont, CA (US);
Hung-Chen Lin, Hsinchu (TW)

(73) Assignees: Champion Microelectronic Corp.,
Hsinchu (TW); Yutechnix, Inc.,
Saratoga, CA (US)

( * ) Notice: Subject to any disclaimer, the term of this patent is extended or adjusted under 35 U.S.C. 154(b) by 0 days.

(21) Appl. No.: 15/256,531

(22) Filed: Sep. 3, 2016

(65) Prior Publication Data
US 2018/0019348 A1    Jan. 18, 2018

Related U.S. Application Data

(60) Provisional application No. 62/363,204, filed on Jul. 16, 2016.

(51) Int. Cl.
*H01L 29/872*    (2006.01)
*H01L 29/06*    (2006.01)
(Continued)

(52) U.S. Cl.
CPC ........ *H01L 29/8725* (2013.01); *H01L 21/265* (2013.01); *H01L 29/0688* (2013.01);
(Continued)

(58) Field of Classification Search
CPC ............ H01L 29/8725; H01L 29/0615; H01L 21/265; H01L 29/08; H01L 29/04;
(Continued)

(56) References Cited

U.S. PATENT DOCUMENTS

| | | | | |
|---|---|---|---|---|
| 4,310,362 A | * | 1/1982 | Roche | H01L 29/872 148/DIG. 139 |
| 4,609,407 A | * | 9/1986 | Masao | H01L 21/268 257/401 |

(Continued)

OTHER PUBLICATIONS

Chen et al.; High-Voltage TMBS Diodes Challenge Planar Schottkys, Power Electronics Technology, Oct. 2006, pp. 22-32.
(Continued)

*Primary Examiner* — Marc Anthony Armand
(74) *Attorney, Agent, or Firm* — Cheng Intellectual Property Group

(57) ABSTRACT

Apparatus, methods and other embodiments associated with a high speed and high breakdown voltage Schottky rectifier are disclosed. In one embodiment, the Schottky rectifier has three layers of N-type semiconductor, a first layer of highly doped N-type substrate at the bottom, a second layer of lightly doped epitaxial N-type material above the first layer, and a third layer of very low doping concentration N-type material created by converting the top shallow portion of the second layer without turning into P-type. The Schottky device further includes an enclosed deep trench structure close to the bottom of the second layer and can sustain high reverse bias voltage up to 2,000 volt.

6 Claims, 6 Drawing Sheets

(51) Int. Cl.
*H01L 29/66* (2006.01)
*H01L 21/265* (2006.01)
*H01L 29/36* (2006.01)
*H01L 29/47* (2006.01)

(52) U.S. Cl.
CPC .......... *H01L 29/0692* (2013.01); *H01L 29/36* (2013.01); *H01L 29/66143* (2013.01); *H01L 29/47* (2013.01)

(58) Field of Classification Search
CPC ........... H01L 29/0688; H01L 29/66143; H01L 29/47; H01L 29/45
See application file for complete search history.

(56) References Cited

U.S. PATENT DOCUMENTS

| | | | |
|---|---|---|---|
| 6,566,936 | B1 | 5/2003 | Yu |
| 7,713,822 | B2 | 5/2010 | Thorup et al. |
| 7,795,103 | B2 | 9/2010 | Yu |
| 7,880,166 | B2 | 2/2011 | Yu |
| 7,911,033 | B2 | 3/2011 | Yu |
| 8,669,554 | B2 | 3/2014 | Yu |
| 9,263,598 | B2 | 2/2016 | Quddus et al. |
| 2005/0202661 | A1* | 9/2005 | Ceruzzi .............. H01L 29/0615 438/570 |
| 2007/0215953 | A1* | 9/2007 | Voldman ............. H01L 21/8249 257/372 |
| 2010/0032731 | A1* | 2/2010 | Babcock ............. H01L 27/095 257/280 |

OTHER PUBLICATIONS

Mehrotra et al.; Trench MOS Barrier Schottky (TNBS) Rectifier: A Schottky Rectifier with Higher Than Parallel Plane Breakdown Voltage, Solid-State Electronics, 1995, pp. 801-806, vol. 38.

Rodov et al.; Super Barrier Rectifier—A New Generation of Power Diode, IEEE Transactions on Industry Applications, Jan./Feb. 2008, pp. 234-237, vol. 44, No. 1.

Hsu et al.; Innovative Designs Enable 300-V TMBS with Ultra-low On-state Voltage and Fast Switching Speed, IEEE Proceedings of the 23rd International Symposium on Power Semiconductor Devices & IC's, May 2011, pp. 80-83.

\* cited by examiner

HIGH SPEED SCHOTTKY RECTIFIER

CROSS REFERENCE

This application claims the benefit of U.S. Provisional Application with Ser. No. 62/363,204 filed on Jul. 16, 2016, the entire contents of which is hereby incorporated by reference as if fully set forth herein, under 35 U.S.C. § 119(e).

FIELD OF INVENTION

This invention generally relates to semiconductor power device technology. More specifically, it is related to structures and methods for forming a high switching speed Schottky rectifier in high voltage application.

DESCRIPTION OF THE RELATED ART

Schottky rectifiers are popular for high-frequency applications due to their high performance characteristics including low forward voltage at reasonable leakage current, and small reverse recovery time. Their low forward voltage improves power consumption and power supply efficiency, where they are ideal for the output stages of switching power supplies. Their switching speed is faster than a comparable pn-junction diode, but they have the drawbacks such as high leakage and limited breakdown voltage range. Thus, silicon-based Schottky rectifiers are limited to applications with operating voltage below 300 V.

Techniques used to increase breakdown voltage have resulted in increases in the Schottky rectifier's forward voltage and reverse leakage current, and thus reduce its switching speed. For example, it is typical to use guard ring structure, high-resistivity silicon epitaxial layer and high Schottky barrier height to increase higher breakdown voltage. However, these techniques tend to use thick epitaxial layer while lowering current density, and thus lose its advantage of high switching speed and low forward-voltage drop. Accordingly, there exists a need for a Schottky rectifier for high voltage application without the above limitations or drawbacks.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY

The present invention overcomes the limitations of Schottky rectifier for high voltage application up to 2,000 V while improving the switching speed and reducing reverse leakage current.

Various embodiments of methods and apparatus for high switching speed and high voltage application Schottky rectifier are contemplated. In one embodiment, a Schottky device comprises three layers of semiconductor material and all three layers have the same conductivity type. The first layer is a semiconductor substrate. The second layer is an epitaxial layer deposed on top of the first layer, and has doping concentration lower than the concentration of the first layer. The third layer, a single crystal, extending from the top surface of the second layer, is a shallow portion of the second layer. The third layer is created by reducing the concentration of the top portion of the second layer to a degree not turning the third layer into a second conductivity type which has opposite polarity to the first conductivity type. A Schottky contact is in contact with the top surface of the third layer.

In one embodiment, the third layer is in round or oval shape and covers only the center portion of the second layer. In another embodiment, the third layer is only at the four upper corners of the Schottky device. In another embodiment, the third layer is in ring shape that the center portion of the ring is the second layer. In another embodiment, the depth of the third layer is around 1/20 to 1/60 ratio of the depth of the second layer.

In one embodiment, the Schottky rectifier has an enclosed deep trench along its periphery, which extends from the top surface of the third layer into the semiconductor material and close to the bottom of the second layer such that the depletion regions created by the enclosed deep trench pinch off inside the second layer under high reverse bias voltage up to 2,000 volt.

In one embodiment, the Schottky rectifier has an enclosed deep trench along its periphery and one or more shallow trenches, and the distance between any two adjacent trench structures, either two shallow trench structures or a shallow trench and the enclosed deep trench, is small enough to allow depletion regions of all the trench structures to pinch off when the Schottky device is in reverse bias.

These and other embodiments will become apparent upon reference to the following description and accompanying drawings.

BRIEF DESCRIPTION OF THE DRAWINGS

The present invention is illustrated by way of example, and not by way of limitation in the figures of the accompanying drawings and in which like reference numerals refer to similar elements and in which.

DETAILED DESCRIPTION

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

First Embodiment

Structure and Property

Figure 1A:
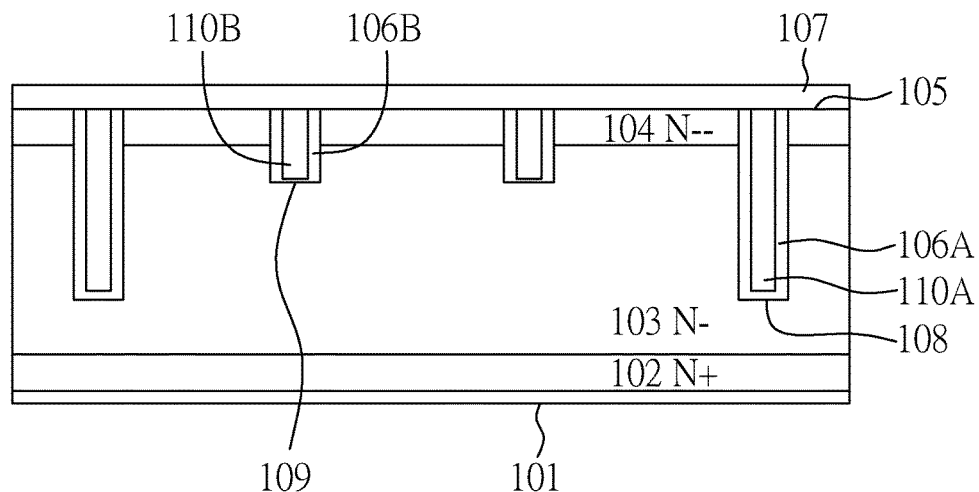
FIG. 1A illustrates a cross-sectional view of a Schottky rectifier, according to an embodiment.

FIG. 1A illustrates the first embodiment of the present invention for a Schottky rectifier 100. This figure shows the cross-sectional view of the Schottky rectifier device 100 which has the following structures: a backside metallization layer 101, a N+ layer 102, a N− epitaxial layer 103, a thin N−− layer 104, and a metal layer (e.g. PtSi$_2$ or WSi$_2$) 107. Each layer is laid on top of the previous layer. The device 100 further includes an enclosed deep dual-film trench structure 108, and two shallow dual-film trench structures 109.

The backside metallization layer 101 can be TiNiAg. The N+ layer 102 is a heavily doped n-type substrate with concentration around $1 \times 10^{18}/cm^3$ or higher, such as As or Phos doping. The N− layer 103 is a lightly doped n-type epitaxial layer with doping concentration around $1 \times 10^{16}/cm^3$. The depth of N+ layer 102 and N− layer 103 together is about 6~8 mil. The N−− layer 104 is a thin layer and may be created with two methods. The first method is adding implant into the top portion of the N− layer 103, and turn that portion (around 1~2 um of depth) into a thin N−− layer having concentration around $1 \times 10^{15}/cm^3$ by using (1) Boron implant, (2) Boron Difluoride (BF$_2$) implant, (3) BF$_2$-As co-implant, or (4) B-As co-implant. The second method is adding a thin epitaxial N−− layer 104 about 2 um on top of N− layer 103 by using doping concentration around $1 \times 10^{15}/cm^3$. In other words, the first method is reducing the concentration of a top portion of the N− layer 103 to create the thin N−− layer 104, while the second method is adding a separate thin epitaxial N−− layer 104 on top of and outside the N− layer 103. Both N− layer 103 and N−− layer 104 are single crystal material.

For Schottky interface 105 between N−− layer 104 and metal layer 107, metal Pt can sustain high operating temperature (175° C.) and high voltage. The enclosed deep trench structure 108 is etched around the periphery of the device 100 and is a dual-film structure where the inside trench is filled with doped polysilicon 110A and its sidewall is gated oxide 106A. The shallow trench structures 109 have similar dual-film structure and material as that of the deep trench structure 108. In an alternative embodiment, the device 100 may not have any trench structures 108 and 109. Yet in another embodiment, the device 100 may have only deep trench structure 108. Yet, in an alternative embodiment, the device 100 may not have N−− layer 104.

Table 1 and table 2 below illustrate different Schottky barrier height (eV) of metal silicide interface formed between N−− layer 104 and metal layer 107. To prevent metal spiking, a layer of TiN may be added before adding metal layer. The process of TiN layer is around 1,000 um. Table 1 shows the commonly used metals for Schottky rectifier and their corresponding barrier height. Table 2 shows the reduced barrier height of the combination of various metal and silicon interface. For example, the barrier height of Pt is 0.9 eV and is reduced to 0.78 eV for PtSi$_2$ metal silicide interface at normal temperature.

TABLE 1

| Metal | Al | Ti | Cr | Mo | Pt | W |
|---|---|---|---|---|---|---|
| Work Function | 4.2 | 0.5 (N) 0.6 (P) | 4.5 | 4.6 | 5.65 | 4.55 |
| Barrier Height(eV) | 0.72 | | 0.67 | 0.68 | 0.9 | 0.67 |

TABLE 2

| | Silicide | | | | |
|---|---|---|---|---|---|
| | TiSi2 | CrSi2 | MoSi2 | PtSi2 | Wsi2 |
| Barrier Height(eV) | 0.6 | 0.57 | 0.55 | 0.78 0.84 (high Temp of 600° C.) | 0.65 |
| Anneal Temp( C.). | 650 | | | 300 | 650 |

Figure 1B:
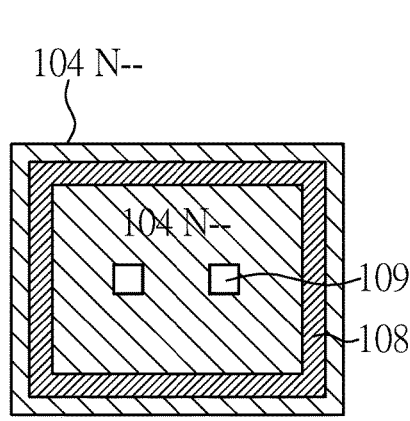
FIG. 1B illustrates a top view of the Schottky rectifier of FIG. 1A, according to an embodiment.

FIG. 1B illustrates the trench structures 108 and 109, and N−− layer 104 in FIG. 1A, and is not scaled to actual size. This figure shows the top view of FIG. 1A Schottky rectifier device 100. It has an enclosed rectangular deep trench structure 108 along the periphery of the device 100 with depth around 20~40 um and width around 1~4 um. The thin N−− layer 104 is implanted on the whole top surface of epitaxial N− layer 103 but below metal layer 107 as shown in FIG. 1A. The Schottky interface 105 of metal-semiconductor junction is formed between metal layer 107 and N−− layer 104. This device 100 further includes two shallow trench structures 109 which could be square, rectangular or round shape, although a square shape is shown in FIG. 1B. The distance between any two adjacent trench structures, either two shallow trench structures 109 or a shallow trench 109 and the enclosed deep trench 108, should be small enough to allow inversion layers (or depletion regions) to overlap (or pinch off) each other during reverse bias to block current flow. The depth and width of the shallow and deep trenches depend on application. In general, the depth of shallow trenches 109 is less than 5 um, and the depth of the deep trench 108 is roughly four times the depth of a shallow trench 109. Although only two shallow trench structures 109 are shown in FIG. 1B, more than two shallow trenches may be used.

Benefits of the Structure

In FIG. 1A, the thin N−− layer 104 created by Boron or BF$_2$ implant above the N-epitaxial layer 103 and below the metal layer 107 provides the benefits of improving switching speed because the overall charge region in N layers 102~104 is compensated and reduced by Boron or BF$_2$ implant. In other words, the thin N−− layer 104 reduces the built-in potential as compared to a device without this layer. This improvement is for both forward bias and reverse bias. This benefit can be illustrated by its operation to be described later in FIG. 1D and corresponding description in FIGS. 3A and 4 later. The difference between Boron and BF$_2$ implant is that the N−− layer 104 is thinner for BF$_2$ implant than for Boron implant, and thus Boron implant results in faster switching speed than that of BF$_2$ implant.

In FIG. 1B, the deep trench structure 108 helps increase the reverse breakdown voltage around 20% although it may need higher cost to manufacture. In addition, deep trench structure 108 also reduces the thickness of epitaxial N− layer 103, and thus reduces the resistance and increases current density under forward bias. When reverse bias is applied to the device 100, a sidewall MOS effect is created in the deep trench structure 108, and its corresponding inversion layer helps reduce current flow. The relationship between the thickness of epitaxial N- layer 103 and the depth of the deep trench structure 108 play an important role that allows the device 100 to sustain extreme high voltage up to 2,000V with very little or no leakage current under reverse bias. For example, the thickness of an epitaxial N- layer for 600V application is around 50 um. However, the device 100 of present invention makes epitaxial N- layer 103 thinner to be less than 40 um and at the same time allows the deep trench structure 108 to reach the bottom of N- layer 103 easier at lower cost. Thus, the effective resistance in N- layer 103 is lower, and the combination results in a very high breakdown voltage with very little leakage current. The effect of the breakdown voltage increase is illustrated in FIG. 3B to be described later.

Figure 1C:
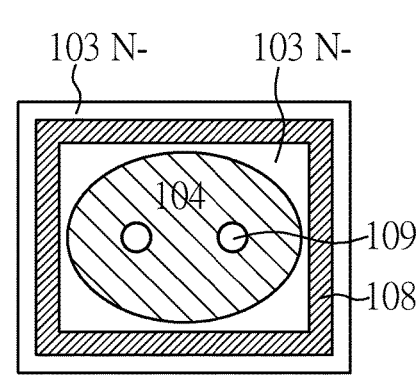
FIG. 1C illustrates a top view of the Schottky rectifier of FIG. 1A, according to another embodiment.

FIG. 1C illustrates an alternative embodiment with a variation of $N^{--}$ layer 104 in FIG. 1B. Instead of covering the whole top surface of epitaxial N- layer 103, the thin $N^{--}$ layer 104 in FIG. 1C can be created in a round or oval shape covering only the center portion of epitaxial N- layer 103, while the remaining structures including N- layer 103, deep trench 108 and shallow trenches 109 are the same as in FIG. 1B. The benefit of the round or oval $N^{--}$ layer 104 in FIG. 1C is that it has better Schottky effect than that of FIG. 1B because it reduces nonuniform corner Schottky effect, and thus this alternative embodiment has better surface breakdown voltage.

Manufacture Process

The manufacture process for FIGS. 1A and 1B of device 100 is described below:

Step 1: Create a heavily doped N type substrate 102 with doping concentration around $1 \times 10^{18}/cm^3$.

Step 2: Add a lightly doped N type epitaxial layer 103 with doping concentration around $1 \times 10^{16}/cm^3$.

Step 3: With the first method, use Boron or $BF_2$ implant at low energy to implant at the top surface of N type epitaxial layer 103 to reduce the surface concentration and create a thin $N^{--}$ layer 104 with concentration around $1 \times 10^{15}/cm^3$ as shown in FIG. 1A. When applying the implant, use photo resist to block high concentration ions, such that it results in concentration of $1 \times 10^{15}/cm^3$ around the depth of 0.3 um of the original epitaxial layer 103. The depth of $N^{--}$ layer 104 depends on the implant dose energy and annealing temperature. The goal is to reduce N- 103 epitaxial layer surface concentration, but not to convert it into P-type junction. The depths of N- layer 103 and $N^{--}$ layer 104 depend on the application. For example, for 100V application, the preferred depth is around 20 um for N- layer 103 and 1 um for $N^{--}$ layer 104. For 600V application, the preferred depth is around 60 um for N- layer 103 and 1 um for $N^{--}$ layer 104, or 1/60 ratio. Alternative, with the second method, an epitaxial $N^{--}$ layer 104 about 2 um in depth may be added above N- layer 103 as a separate layer with doping concentration around $1 \times 10^{15}/cm^3$.

Step 4: Etch a deep trench structure 108 around the periphery of the device 100 as shown in both FIGS. 1A & 1B. The trench depth and width depends on the performance requirements, and it can be as deep and close to the bottom of but not beyond N- 103 layer.

Step 5: Etch two shallow trench structures 109 in the middle of the device 100 as shown in FIGS. 1A and 1B.

Step 6: Grow thermal oxide 106A on the top and wall of deep trench 108, and oxide 106B on the top and wall of shallow trenches 109, then fill the trenches with polysilicon 110A and 110B, respectively. Remove the remaining polysilicon and oxide at the top of trenches 108 and 109 afterward.

Step 7: Deposit a first part of metal layer 107 which is a thin metal (e.g. Ti or Pt or W around 100 Å) on top of both $N^{--}$ layer 104 and the trenches 108 and 109. Then add a second part of metal layer 107, a thick top metal (e.g. Al) around 4 um above the first part for bonding. The two parts of metal are together shown as layer 107.

Step 8: Use back-lap to reduce the wafer thickness from 16 mil to around 6~8 mil, and then add backside metal 101 deposition.

Operation

Figure 1D:
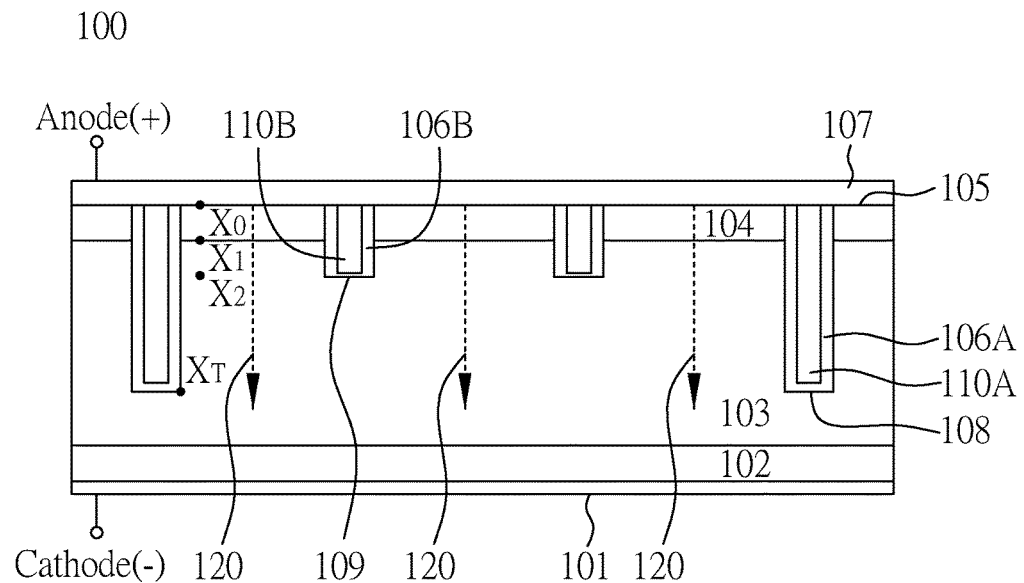
FIG. 1D illustrates the operation of the Schottky rectifier of FIG. 1A during forward bias, according to an embodiment.

FIG. 1D illustrates the operation of device 100. Because of reduced built-in potential (Vbi) due to the thin $N^{--}$ layer 104, the current is easier to be turned on. The current 120 flows uniformly from anode through the cross sections of Schottky layer 105 between metal-semiconductor junction, $N^{--}$ layer 104, N-epitaxial layer 103 all the way down to N+ substrate 102 during forward bias. The points $X_0$, $X_1$ and $X_2$ indicate different vertical depths in the cross section of the device 100. They correspond to the different points on the horizontal X axis of FIG. 3A of electrical field diagram to be discussed later.

Figure 1E:
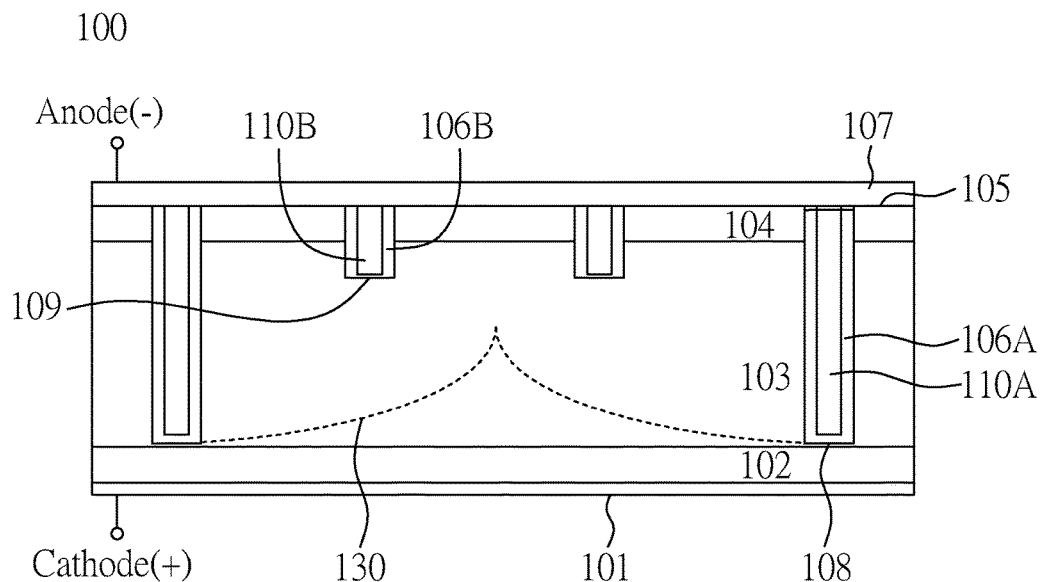
FIG. 1E illustrates the operation of the Schottky rectifier of FIG. 1A under reverse bias, according to an embodiment.

Turning to FIG. 1E. During the reverse bias, inversion layers (or depletion regions) created by the MOS sidewalls (polysilicon 110-oxide 106-Epi 103) of any two adjacent trenches (either deep and shallow trenches 108 & 109 or two shallow trenches 109) overlap (or pinch off), and thus reduce the leakage current which flows in upward direction from cathode to anode. When the enclosed deep trench structure 108 are very deep and close to the bottom of N-epitaxial layer 103, the inversion layers (or depletion regions) 130 of the deep trench structure 108 shown on the left and right sides of FIG. 1E can completely overlap (or pinch off) under extremely high voltage up to 2,000 V even without the help of the shallow trench structures 109.

Second Embodiment

Structure and Property

Figure 2A:
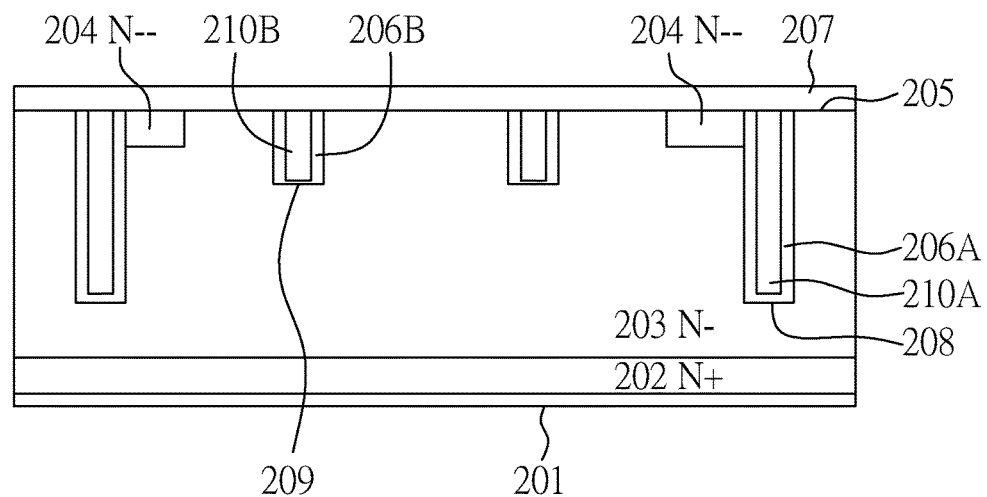
FIG. 2A illustrates a cross-sectional view of a Schottky rectifier, according to another embodiment.

FIG. 2A illustrates the second embodiment of the present invention for a Schottky rectifier 200. This figure shows the cross-sectional view of the Schottky rectifier device 200. The three bottom layers, namely backside metallization layer 201, N+ substrate layer 202, and N- epitaxial layer 203 are the same as those of FIG. 1A.

In this embodiment, a thin $N^{--}$ layer of Boron or $BF_2$ implant 204 is created at each upper corner of the device 200 and the top surface of N- epitaxial layer 203, and has depth around 0.3 um and width around 1~3 um. The depth and width depend on the dose and implant energy. The $N^{--}$ layer 204's concentration is around $1 \times 10^{15}/cm^3$. The deep trench structure 208 and shallow trench structure 209 are similar to those in FIG. 1A. Both trench structures 208 and 209 are dual-film filled with doped polysilicon 210A and 210B, and gated oxide sidewalls 206A and 206B, respectively.

Figures 2B, 2C:
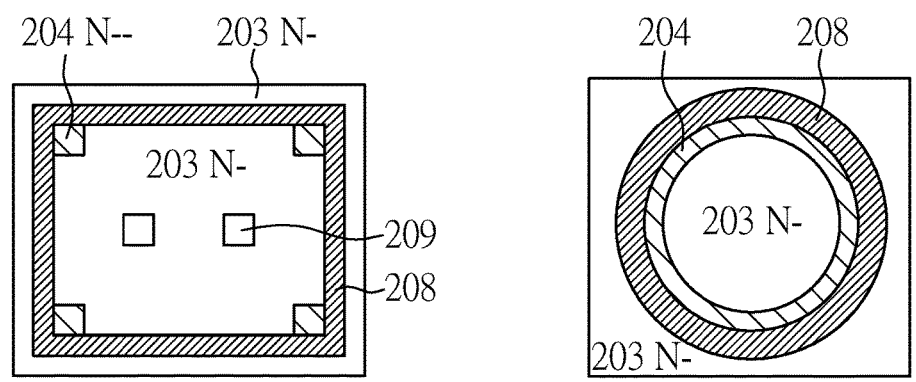
FIG. 2B illustrates a top view of the Schottky rectifier of FIG. 2A, according to an embodiment.
FIG. 2C illustrates a top view of the Schottky rectifier of FIG. 2A, according to another embodiment.

FIG. 2B illustrates the trench structures 208 and 209, $N^{--}$ layer 204 and epitaxial N- layer 203. This figure shows the top view of FIG. 2A Schottky rectifier device 200. This embodiment has a fully enclosed rectangular deep trench structure 208 with the $N^{--}$ layer 204 at four inside corners of the deep trench structure 208. Each $N^{--}$ layer 204 at a corner is a square of width around 1~3 um, and thus area size around 1~9 $um^2$. Alternatively, the corner $N^{--}$ layer 204 may be a circle with radius around 1~3 um. The $N^{--}$ layer 204 at four corners help reduces current crowding and surface edge breakdown, and thus breakdown voltage will not degrade. FIG. 2B also has two shallow trench structures 209 in the middle of the device 200, and the shallow trenches 209 can be square, rectangular or round shape, although a square shape is shown here. Because the $N^{--}$ layer 204 are at only four top corners, the rest of top surface is still N- layer 203.

Benefits of the Structure

Like the device 100 in FIGS. 1A and 1B, the device 200 in FIGS. 2A and 2B has the same benefits of improving switching speed, reducing overall charge region in N layers 202~204 and increase current density because of deep trench structure 208 and shallow trench structures 209. The differences in benefits between FIG. 1A and FIG. 2A are the followings:

(1) Although both have higher switching speed than regular rectifiers, switching speed of the device 100 in FIG. 1A is higher than that of the device 200 in FIG. 2A because FIG. 1A has greater impact on reducing built-in potential Vbi.

(2) The device 100 of FIG. 1A has lower manufacture cost than that of FIG. 2A because FIG. 2A needs additional implant mask.

(3) The device 200 of FIG. 2A is more uniform in manufacture of breakdown voltage of each device than the device of FIG. 1A because FIG. 2A's corner charge breakdown voltage is higher. In other words, the device of FIG. 2A further reduces the possibility of edge breakdown because of the corner $N^{--}$ layer 204.

FIG. 2C illustrates an alternative embodiment with an inner ring shape $N^{--}$ layer 204 and outer ring shape deep trench structure 208. Instead of having implant on only four inner corners of a rectangular deep trench structure, FIG. 2C has a ring shape deep trench structure 208 around the periphery of the device 200, and add a thin ring shape $N^{--}$ layer 204 implant on the top surface of epitaxial N- layer 203 but inside the deep trench structure 208. In other words, the diameter of the deep trench structure ring 208 is larger than that of $N^{--}$ layer 204. The ring shape $N^{--}$ layer 204 has better Schottky effect because it reduces the non-uniform Schottky effect at edge when compared to a rectangular shape, so it has a more uniform current density. The ring shape deep trench structure 208 has the benefit of reducing edge electric field at sharp corner for high voltage Schottky application, because unlike the rectangular trench structure, the circular structure has no high field corner.

Manufacture Process

The manufacture process for FIGS. 2A and 2B of device 200 is partially similar to that of device 100 and described below:

Step 1: Create a heavily doped N type substrate 202 with doping concentration around $1 \times 10^{18}/cm^3$.

Step 2: Add a lightly doped N type epitaxial layer 203 with doping concentration around $1 \times 10^{16}/cm^3$.

Step 3: Add masked photo resist in the center portion of top surface without covering the four corners as shown in FIG. 2B.

Step 4: Use Boron or $BF_2$ implant to create a thin $N^{--}$ layer 204 at the corners of the top surface of N type epitaxial layer 203 to reduce the surface concentration to around $1 \times 10^{15}/cm^3$ as shown in FIGS. 2A & 2B.

Step 5: Remove the photo resist, and etch a deep trench structure 208, no deeper than the N-epitaxial layer 203, around the periphery of device 200 as shown in FIG. 2B, to create a fully enclosed rectangular trench structure.

Step 6: Etch two shallow trench structures 209 in the middle of the device 200 as shown in FIGS. 2A and 2B.

Step 7: Grow thermal oxide 206A on the top and wall of deep trench 208, and oxide 206B on the top and wall of shallow trench 209, then fill the trenches with polysilicon 210A and 210B respectively. Remove the remaining polysilicon and oxide at the top of trenches 208 and 209 afterward.

Step 8: Deposit metal layer 207 on top of N- layer 203, corner $N^{--}$ layer 204, and the trench structures 208 and 209.

Step 9: Use back-lap to reduce the wafer thickness from 16 mil to around 6~8 mil, and then add backside metal 201 deposition.

Operation

Figure 2D:
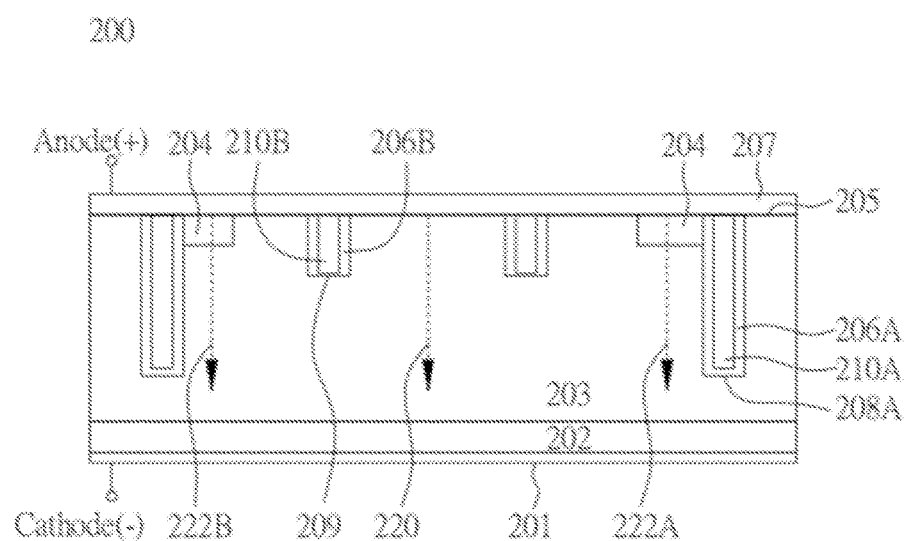
FIG. 2D illustrates the operation of the Schottky rectifier of FIG. 2A during forward bias, according to an embodiment.

FIG. 2D illustrates the operation of the device 200 in FIG. 2A. During forward bias, the current 222A and 222B flow from anode through the Schottky interface 205 between metal-semiconductor junction, $N^{--}$ layer 204 at the two corners of device 200, then down to N- epitaxial layer 203 and N+ substrate 202. The current 220 flows from Schottky layer 205 to N- epitaxial layer 203 and then N+ layer 202. The current 222A and 222B at two corners are higher than the current 220 in the middle, and all current flow in parallel. Normally, the edge of a semiconductor is easy to break down. By adding the $N^{--}$ layer 204 at corners, the device 200 has larger current 222 and can reduce edge breakdown, and hence becomes more reliable. During the reverse bias, similar to FIG. 1E, inversion layers (or depletion regions) created by the MOS sidewalls of any two adjacent trenches (either trenches 208 & 209 or two trenches 209) overlap (or pinch off), and thus reduce the leakage current which flow in upward direction from cathode to anode.

Surface and Bulk Breakdown Voltage

Figure 3A:
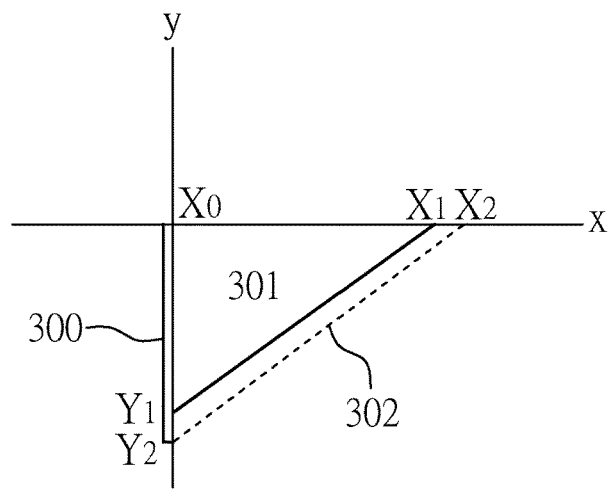
FIG. 3A illustrates built-in potential of the Schottky rectifier of FIG. 1A, according to an embodiment.
Figure 3B:
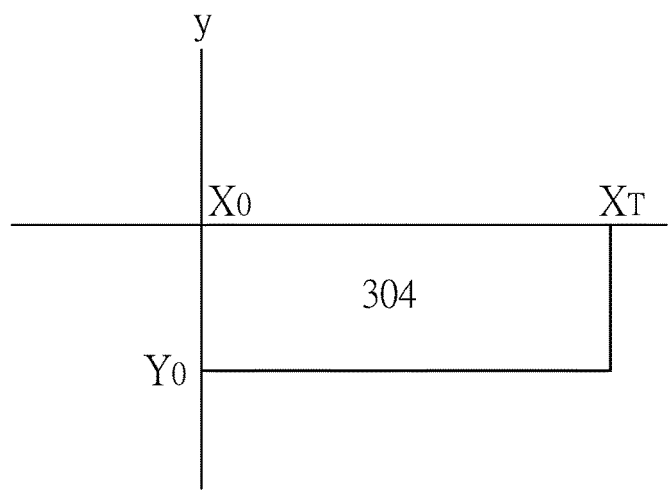
FIG. 3B illustrates total field charge of the Schottky rectifier of FIG. 1A, according to an embodiment.

FIG. 3A illustrates the built-in potential of a device similar to FIG. 1A but without trench structure 108 for the purpose of explaining the benefits of $N^{--}$ layer 104 that result in faster switching speed. Y axis is the charge concentration (or electrical field), and X axis is the vertical depth of device FIG. 1A (same as FIG. 1D). In FIG. 3A, three points $X_0$, $X_1$ and $X_2$ on the X-axis are used to represent different depths in FIG. 1D. The point $X_0$ represents the depth at the interface between metal layer 107 and $N^{--}$ layer 104 (i.e. the Schottky interface 105). The point $X_1$ represents the depth at the interface between $N^{--}$ layer 104 and N- layer 103 when forward bias is applied. The point $X_2$ is the depth at the interface between $N^{--}$ layer 104 and N- layer 103 when no voltage is applied (i.e. zero bias). In FIG. 3A, the area 300 is the charge in metal 107. The enclosed triangular area of dash line 302 between points $Y_2$, $X_0$ and $X_2$ represents the built-in potential (Vbi) of device FIG. 1D (or FIG. 1A) at zero bias. When a forward bias is applied, the interface between $N^{--}$ layer 104 and N- layer 103 moves to point $X_1$ which is shallower than the point $X_2$. Thus, majority carrier charge is reduced as illustrated in the enclosed triangular area of solid line 301 between points $Y_1$, $X_0$ and $X_1$.

When adding the deep trench structure 108 and shallow structures 109, the diagram for built-in potential (Vbi) of device in FIG. 1A under forward bias is substantially the same as FIG. 3A.

FIG. 3B illustrates the total field charge of the device in FIG. 1A (i.e. includes both $N^{--}$ layer 104 and trench structures 108 and 109) under reverse bias for high voltage application. The point $X_T$ is the depth of deep trench structure 108. The charge concentration (or electric field) $Y_0$ remains constant across the vertical depth and becomes zero at the depth $X_T$ of FIG. 1D. The enclosed rectangular area 304 is the total field charge accumulated around the deep trench 108 of the device 100 in FIG. 1E (or FIG. 1A).

When the polysilicon 110A in deep trench 108 is connected to epitaxial N− layer 103 with ground potential, a sidewall MOS (polysilicon-oxide-Epi) will form. Under certain substrate bias condition, the sidewall MOS can form an inversion layer at side surface adjacent to the trench 108. This is more likely to happen for a very light Epi doping concentration, for example, lower than $1 \times 10^{16}/cm^3$ which is useful for high voltage Schottky application. When the sidewall MOS is turned on, it will reduce Epi resistance and greatly improve high voltage Schottky forward conduction. A good sidewall MOS requires proper trench depth, Mesa width and light Epi doping. As a result, it can create a Schottky device with sufficiently high voltage and low resistance with high forward current and fast response due to surface barrier arrangement.

Figure 4:
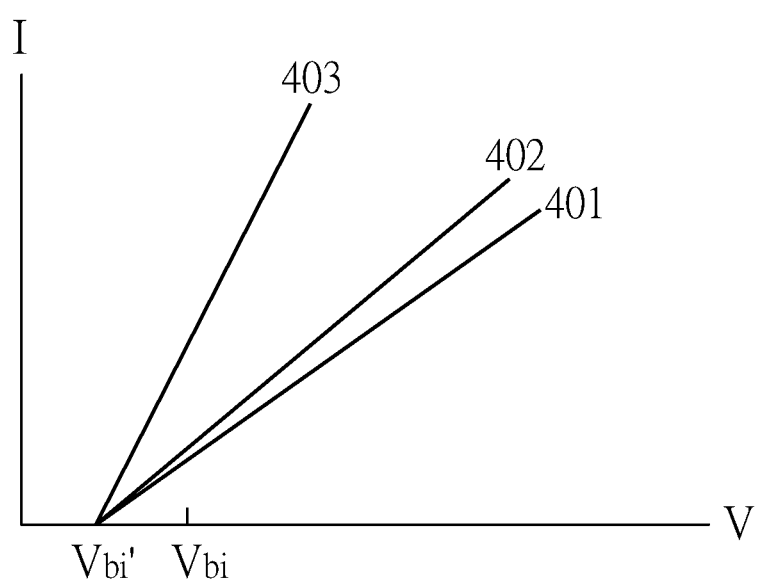
FIG. 4 illustrates I-V curve of the Schottky rectifier of FIG. 1A, according to an embodiment.

FIG. 4 illustrates the I-V curve of a Schottky rectifier of FIG. 1A. The X-axis is the voltage and Y-axis is the current. In FIG. 4, Vbi is the built-in potential for a rectifier without $N^{--}$ layer 104. After adding the thin $N^{--}$ layer 104 as shown in FIG. 1A, the built-in potential is reduced and become Vbi'. Line 401 illustrates the I-V curve of a device similar to FIG. 1A but has neither deep trench structure 108 nor shallow trench structures 109. Line 402 illustrates the I-V curve of a device similar to FIG. 1A with deep trench structure 108 and shallow trenches 109 because thinner epitaxial layer 103 reduces total resistance. Line 403 illustrates the I-V curve of the device of FIG. 1A with both trench structure 108 and 109, and $N^{--}$ layer 104 under forward bias and sidewall MOS is turned on.

In summary, the $N^{--}$ layer 104 reduces the built-in potential of a Schottky rectifier and increase switching speed as a result. The trench structures 108 and 109 can support extremely high voltage, and reduce total resistance to increase current density.

This specification includes references to "one embodiment", "an embodiment", and "an alternative embodiment". The appearance of the same phrase in different contexts does not necessarily refer to the same embodiment. Particular features, structures, or characteristics may be combined in any suitable manner consistent with this invention. Furthermore, as used throughout this application, the word "may" is used in a permissive sense (i.e., meaning having the potential to), rather than the mandatory sense (i.e., meaning must). Similarly, the words "include", "including", and "includes" mean including, but not limited to.

"Comprising" or "Including." These terms are open-ended. As used in the appended claims, this term does not foreclose additional structure or steps. Consider a claim that recites: "A device comprising a semiconductor layer . . . " Such a claim does not foreclose the device from including additional structures (e.g., a trench, another semiconductor layer).

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

What is claimed is:

1. A Schottky device, comprising:
   a first layer of a semiconductor material of a first conductivity type;
   a second layer of the semiconductor material deposed on top of the first layer, wherein the second layer is an epitaxial layer with doping concentration lower than the doping concentration of the first layer;
   a ring-shape region inside a top portion of a surface of the second layer, wherein the ring-shape region has lower doping concentration than the rest of the second layer, wherein the ring-shape region's doping concentration is substantially close to neutral but remains in the first conductivity type;
   a metal layer deposed above the second layer and completely overlapping the ring-shape region;
   an enclosed deep trench along periphery of the Schottky device and etched from the top surface of the second layer of the semiconductor material, but not the ring-shape region of the second layer, wherein the enclosed deep trench has an oxide coating on its sidewalls and bottom surface, and a polysilicon layer fills the center of the deep trench and connects to the metal layer for electrode control; and
   a Schottky interface formed between the second layer, the ring-shape region, and the metal layer, wherein the second layer and its ring-shape region are single crystal;
   wherein the first layer, second layer and the ring-shape region have same conductivity type.

2. The Schottky device of claim 1, wherein depth of the ring-shape region of the second layer is around 1/20 to 1/60 ratio of the depth of the second layer.

3. The Schottky device of claim 1, wherein the enclosed deep trench has depth close to bottom of the second layer such that depletion regions created by the enclosed deep trench pinch off inside the second layer under high reverse bias voltage up to 2,000 volts.

4. The Schottky device of claim 1, wherein the enclosed deep trench is in ring shape with larger diameter than the ring-shape region of the second layer, such that the ring-shape deep trench is outside and surrounds the ring-shape region of the second layer.

5. The Schottky device of claim 1, further comprising one or more shallow trench structures within an enclosed area of the enclosed deep trench, wherein depth of the deep trench is about four times the depth of each shallow trench.

6. The Schottky device of claim 5, wherein distance between any of the one or more shallow trench structures and the enclosed deep trench is small enough to allow depletion regions of all the trench structures to pinch off when the Schottky device is in reverse bias.

* * * * *